United States Patent
Yokota

(10) Patent No.: US 9,440,303 B2
(45) Date of Patent: Sep. 13, 2016

(54) HEAT PROCESSING DEVICE

(71) Applicant: Yokota Technica Limited Company, Tokyo (JP)

(72) Inventor: Yatsuharu Yokota, Tokyo (JP)

(73) Assignee: Yokota Technica Limited Company, Tokyo (JP)

( * ) Notice: Subject to any disclaimer, the term of this patent is extended or adjusted under 35 U.S.C. 154(b) by 62 days.

(21) Appl. No.: 14/367,943

(22) PCT Filed: Dec. 25, 2012

(86) PCT No.: PCT/JP2012/083532
§ 371 (c)(1),
(2) Date: Jun. 23, 2014

(87) PCT Pub. No.: WO2013/099886
PCT Pub. Date: Jul. 4, 2013

(65) Prior Publication Data
US 2014/0367451 A1 Dec. 18, 2014

(30) Foreign Application Priority Data
Dec. 26, 2011 (JP) ................................. 2011-283604

(51) Int. Cl.
*B23K 3/08* (2006.01)
*B23K 3/04* (2006.01)
(Continued)

(52) U.S. Cl.
CPC ................. *B23K 3/04* (2013.01); *B23K 1/008* (2013.01); *B23K 1/0016* (2013.01); *B23K 1/012* (2013.01); *B23K 3/087* (2013.01); *B23K 2201/42* (2013.01); *H05K 3/3494* (2013.01)

(58) Field of Classification Search
CPC ....................................................... B23K 1/008
See application file for complete search history.

(56) References Cited

U.S. PATENT DOCUMENTS 5,922,230 A * 7/1999 Yokota .................. B23K 1/008
198/465.3
6,423,945 B1 * 7/2002 Yokota .................. B23K 1/008
219/388
(Continued)

FOREIGN PATENT DOCUMENTS

JP 61-99530 A 5/1986
JP S63-154524 10/1988
(Continued)

OTHER PUBLICATIONS

The extended European Search Report issued in corresponding European Patent Application No. 12862549.8 dated Jun. 9, 2015 (4 pages).
(Continued)

*Primary Examiner* — Devang R Patel
(74) *Attorney, Agent, or Firm* — Kilyk & Bowersox, P.L.L.C.

(57) ABSTRACT

A reflow furnace (1) has a decompression chamber (5), and air bubbles contained in a molten solder on a substrate (7) are removed in this decompression chamber (5). The substrate (7) supported on a first conveying rail (8) is fed into the decompression chamber (5) by a first conveyance rod (18). The substrate (7) in the decompression chamber (5) is taken out by a second conveyance rod (32) and is conveyed to the exit of the reflow furnace (1) while being supported on the second conveying rail (9). Before the treatment of substrates (7) having different widths, the width of the first conveying rail (8) and the width of the second conveying rail (9) are adjusted. During this adjustment, the second conveyance rod (32) is displaced in the width direction of the substrate (7), with the second conveyance rod (32) kept in the decompression chamber (5), and in association with this, the spacing between right and left rail portions (12a, 12a) in the decompression chamber (5) is adjusted.

2 Claims, 10 Drawing Sheets

(51) Int. Cl.
  *B23K 1/008* (2006.01)
  *B23K 1/00* (2006.01)
  *B23K 1/012* (2006.01)
  *H05K 3/34* (2006.01)

(56) References Cited

U.S. PATENT DOCUMENTS

| | | | |
|---|---|---|---|
| 6,437,289 B1 * | 8/2002 | Yokota | B23K 1/008 |
| | | | 219/388 |
| 6,600,137 B1 | 7/2003 | Nonomura et al. | |
| 2013/0263445 A1 | 10/2013 | Yokota | |

FOREIGN PATENT DOCUMENTS

| | | |
|---|---|---|
| JP | 01-228734 | 9/1989 |
| JP | H6-80938 | 10/1994 |
| JP | 2008-010586 | 1/2008 |
| JP | 2008010586 A * | 1/2008 |

OTHER PUBLICATIONS

International Search Report issued in corresponding International Patent Application No. PCT/JP2012/083532 dated Mar. 12, 2013 (6 pages).

* cited by examiner

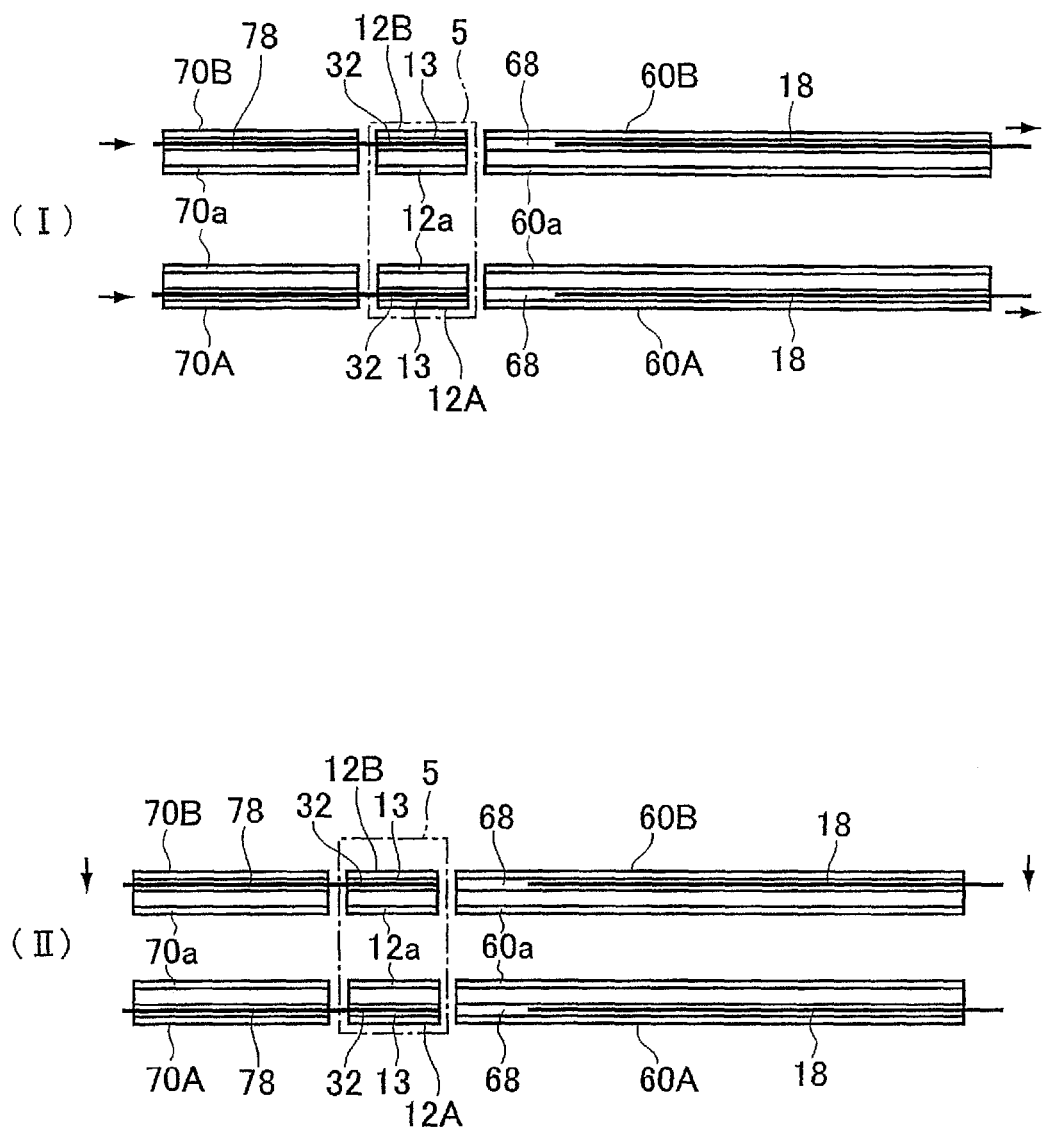

HEAT PROCESSING DEVICE

The present application is a National Stage Application of PCT/JP2012/083532, filed Dec. 25, 2012, which claims priority from Japanese Patent Application No. 2011-283604, filed Dec. 26, 2011.

FIELD OF THE INVENTION

The present invention relates to a heat processing device which has a treatment section performing the heating treatment of an object to be treated (a workpiece) on a conveyance path conveying the object to be treated.

BACKGROUND OF THE INVENTION

A reflow soldering apparatus solders electronic parts to a substrate while conveying, for example, a printed circuit board on which electronic parts are mounted with a cream solder or the like, through the use of a conveyor in a reflow furnace which has a preliminary heating process, a reflow process, and a cooling process in order (refer to Patent Document 1).

On the other hand, there has been proposed a reflow soldering apparatus which is such that in order to prevent air bubbles generated in a soldered portion during soldering from remaining in the soldering portion, a decompression chamber capable of reducing the atmospheric pressure is provided on a substrate conveyance path so that a soldered portion of a substrate which has been melted by heating is degassed in the decompression chamber (refer to Patent Document 2). This reflow soldering apparatus is configured in such a manner that the decompression chamber has, in the interior thereof, a pair of right and left substrate supporting rails and that the spacing (the rail width) between the pair of substrate supporting rails in this decompression chamber can be changed according to the width of the substrate.

More specifically, the substrate conveying rails which are arranged on the upstream side and the downstream side, with the decompression chamber sandwiched therebetween, are such that at least either of the right and left rails is capable of moving in the width direction. By moving this one of the right and left rails, it is possible to adjust the spacing (the rail width) between the conveying rails in such a manner as to adapt to substrates having different widths.

Also, at least either of the pair of substrate supporting rails in the decompression chamber is capable of moving in the width direction. By moving this one of the substrate supporting rails, it is possible to adjust the spacing (the rail width) between the substrate supporting rails in the decompression chamber in such a manner as to adapt to substrates having different widths.

The substrate supporting rails in the decompression chamber and the substrate conveying rails on the upstream side and downstream side of the decompression chamber are coupled together by a rail coupling mechanism. This rail coupling mechanism connects and disconnects the substrate conveying rails and the substrate supporting rails in synchronization with opening and closing actions of a shutter which performs the opening and closing of the decompression chamber. That is, a closing action of the shutter causes the rail coupling mechanism to disconnect the substrate conveying rails and the substrate supporting rails from each other. On the other hand, an opening action of the shutter causes the rail coupling mechanism to couple the substrate conveying rails and the substrate supporting rails together. When the shutter is open, which brings the substrate conveying rails and the substrate supporting rails into an integral condition, it is possible to simultaneously change the spacing between the right and left substrate conveying rails and the spacing between the right and left substrate supporting rails in the decompression chamber.

However, in the structure shown in Patent Document 2, a shutter structure which performs the opening and closing of the decompression chamber is necessary to cause the rail coupling member to go into action in synchronization with the opening and closing actions of the shutter which performs the opening and closing of the decompression chamber.

Patent Document 1: Japanese Patent Laid-Open No. 2000-188467
Patent Document 2: Japanese Patent Laid-Open No. 2011-171714

SUMMARY OF THE INVENTION

The object of the present invention is to provide a heat processing device which is arranged in a treatment section subjecting an object to be treatment to heating treatment and can perform adjustments of the spacing between right and left supporting members which support the object to be treated with a simple configuration.

According to the present invention, the above-described technical problems are solved by providing a heat processing device having a treatment section on a conveyance path conveying an object to be treated, which comprises: a conveyance rod arranged on the above-described conveyance path and capable of a reciprocating motion for conveying the above-described object to be treated; and support members provided in the treatment chamber in rightward and leftward spaced relation for supporting the above-described object to be treated. In the heat processing, at least either of the right and left support members is capable of moving in the transverse direction of the conveyance path, the movable support member has a first groove into which the conveyance rod can be inserted, and the spacing between the right and left support members of the treatment section is adjusted by displacing the conveyance rod in the width direction of the above-described conveyance path, with the conveyance rod inserted into the first groove.

In a preferred embodiment of the present invention, the conveyance rod has a pusher member which engages with the above-described object to be treated, the heat processing device further includes a switching mechanism which causes the conveyance rod to perform an axial rotation in a forward or reverse direction around an axis line thereof, wherein the pusher member can assume an engagement position in which the pusher member engages with the object to be treated and a retracted position in which the pusher member departs from the object to be treated by causing the switching mechanism to go into action. In a more preferred aspect, the switching mechanism comprises a cam mechanism which causes the conveyance rod to perform the axial rotation in the forward or reverse direction in synchronization with the reciprocating motion of the conveyance rod.

"The treatment section" termed in the present invention corresponds to the decompression chamber of the reflow furnace in the embodiment, and this decompression chamber is openable and closable. The treatment section of the present invention may be movable in a direction in which the treatment section departs from the conveyance path in the transverse direction as viewed from the plane.

According to the present invention, adjustments of the width of the conveyance path defined by the right and left support members in the treatment section are performed through the use of the reciprocating conveyance rod. Therefore, it is possible to make the construction of the treatment chamber section in a simple configuration and also maintenance is easy.

Other objects and operational advantages of the present invention will become apparent from detailed descriptions of embodiments of the present invention.

BRIEF DESCRIPTION OF THE DRAWINGS

FIG. 5(a) shows a guide member which is on the right side as viewed from the exit side of a furnace to the entry side thereof, and FIG. 5(b) shows a guide member which is on the left side;

FIGS. 10(I) and 10(II) are diagrams to explain a procedure for adjusting the spacing between right and left substrate supporting members (rail portions) of the decompression chamber. FIG. 10(I) shows the first process for causing the second conveyance rod to enter the decompression chamber, and FIG. 10 (II) shows the second process for displacing the first and second conveyance rods in the width direction of the substrate as a next process.

DESCRIPTION OF SYMBOLS

Figure 1:
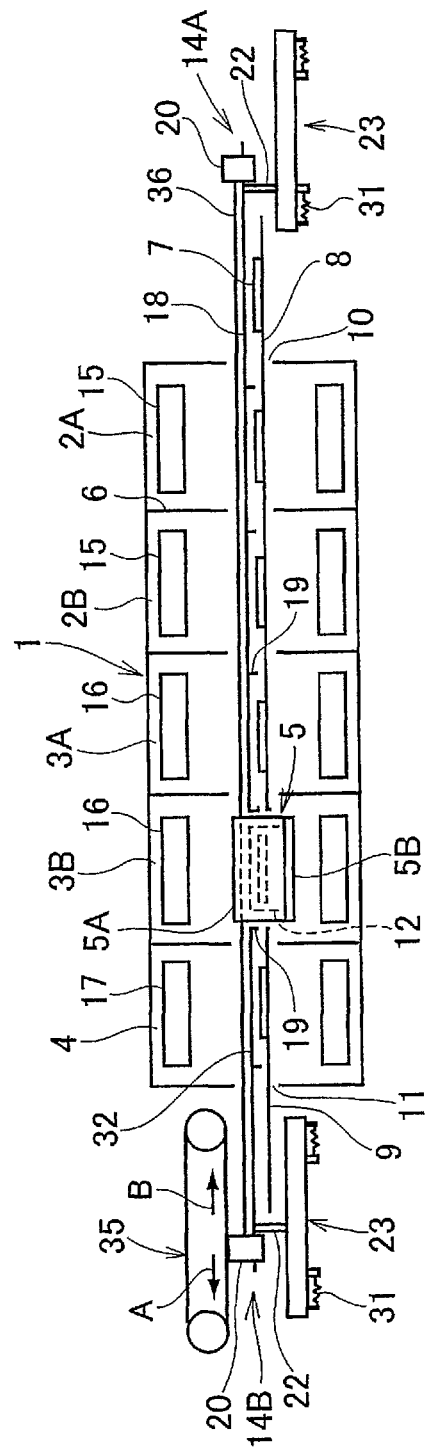
FIG. 1 is a schematic block diagram showing a reflow soldering device apparatus which is an embodiment of the present invention.

1 . . . Reflow furnace
2A, 2B . . . Preliminary heating chamber
3A, 3B . . . Reflow chamber
4 . . . Cooling chamber
5 . . . Decompression chamber
5A . . . Upper-side housing of decompression chamber
5B . . . Lower-side base of decompression chamber
7 . . . Printed circuit board on which electronic parts are mounted
8 . . . Upstream-side substrate conveying rail
9 . . . Downstream-side substrate conveying rail
12 . . . Substrate supporting member in decompression chamber
12a . . . Rail portion of substrate supporting member
13 . . . Concave groove of substrate supporting member
18 . . . First conveyance rod
19 . . . Pusher piece
32 . . . Second conveyance rod

DETAILED DESCRIPTION OF THE INVENTION

In the following, a preferred embodiment of the present invention will be described on the basis of the accompanying drawings.

General Configuration of Reflow Furnace:

As shown in FIG. 1, a reflow soldering apparatus (a reflow furnace 1) has a plurality of stations (chambers) which are partitioned in a direction which substrates are conveyed. The stations are arrayed in series in the interior of the reflow furnace 1. Specifically, the reflow furnace 1 has two preliminary heating chambers 2A, 2B positioned on the right side of the drawing, two reflow chambers 3A, 3B positioned in the middle of the drawing, and one cooling chamber 4 positioned on the left side of the drawing in order in the substrate conveying direction. Furthermore, the reflow furnace 1 has an openable and closable chamber (a treatment chamber), i.e., a decompression chamber 5 in the interior of the reflow chamber 3B. A substrate 7 stops temporarily in each of the chambers 2A, 2B, 3A, 3B. In the chambers the substrate 7 is treated. The decompression chamber 5 is a chamber which performs degassing treatment. Air bubbles contained in a molten solder on the substrate 7 are removed by bringing the chamber 5 into a negative pressure condition. Reference numeral 6 denotes a partition wall which partitions each chamber. An inert gas, which is nitrogen gas in this embodiment, is supplied to the interior of the reflow furnace 1 as an atmospheric gas in order to prevent the oxidation of the solder. Although in this embodiment, the treatment chamber is the decompression chamber 5, instead of this, the treatment chamber may be a chamber in which heating is performed in a hydrogen atmosphere in order to prevent the oxidation of a soldered portion.

In order to convey the printed circuit board substrate (hereinafter referred to simply as the substrate or a workpiece) 7 on which electronic parts are mounted, the reflow furnace 1 has a first substrate conveying rail 8. The first substrate conveying rail 8 is arranged on the upstream side of the decompression chamber 5 of the reflow furnace 1. The reflow furnace 1 has a second substrate conveying rail 9 which is arranged on the downstream-side of the decompression chamber 5. The decompression chamber 5 is sandwiched between the rails 8, 9. The first and second substrate conveying rails 8, 9 are linearly arranged. The first and second substrate conveying rails 8, 9 are each composed of two guide members (which will be described in detail later) which are arranged parallel to each other and horizontally. The first substrate conveying rail 8 is horizontally disposed in the interior of the furnace 1 from a position at the front of an entry 10 of the furnace 1 to a position just at the front of the decompression chamber 5. The second substrate conveying rail 9 is horizontally disposed from just behind the decompression chamber 5 to a position on the downstream side of an exit 11 of the furnace 1. The substrate 7 is conveyed, with right and left edge portions of the lower surface thereof supported by right and left guide members constituting the first or second substrate conveying rail 8, 9.

In the interior of the decompression chamber 5, substrate supporting members 12 (see FIG. 2) are arranged right and left on the conveyance path of the substrate 7. The right and left substrate supporting members 12 has a principal part of a roughly rectangular shape in section. Each of the right and left substrate supporting members 12 has a stepped portion in an end portion of the upper surface on the sides opposed to each other and this stepped portion constitutes a horizontal rail portion 12a. The right and left end portions of the lower surface of the substrate 7 are supported by these right and left rail portions 12a, 12a. On the upper surface of the substrate supporting member 12, a concave groove 13 is formed in parallel to the rail portion 12a to receive the conveyance rod 32, which will be described later. The concave groove 13 extends from one end of the upper surface of the substrate supporting member 12 to the other end thereof.

The substrate 7 which is charged into the reflow furnace 1 is such that a cream solder is applied to a soldered portion on the upper surface thereof and electronic parts are mounted on this cream solder. The substrate 7 is intermittently and sequentially conveyed to the succeeding process in the reflow furnace 1 by first and second conveyance devices 14A, 14B.

That is, the substrate 7 is fed by the first conveyance device 14A from near the entry 10 of the furnace 1 into the first preliminary heating chamber 2A and is heated, in this first preliminary heating process, for a given time with an atmospheric gas heated by a heater 15. Next, the substrate 7 is fed by the first conveyance device 14A into the adjacent second preliminary heating chamber 2B and is heated, in this second preliminary heating process, for a given time with an atmospheric gas heated by the heater 15. Subsequently, the substrate 7 is fed by the first conveyance device 14A into the reflow chamber 3A. In the reflow chamber 3A a reflow process is performed. In the reflow process, the soldered portion is heated for a given time with an atmosphere gas heated by a heater 16 and is melted.

Figure 2:
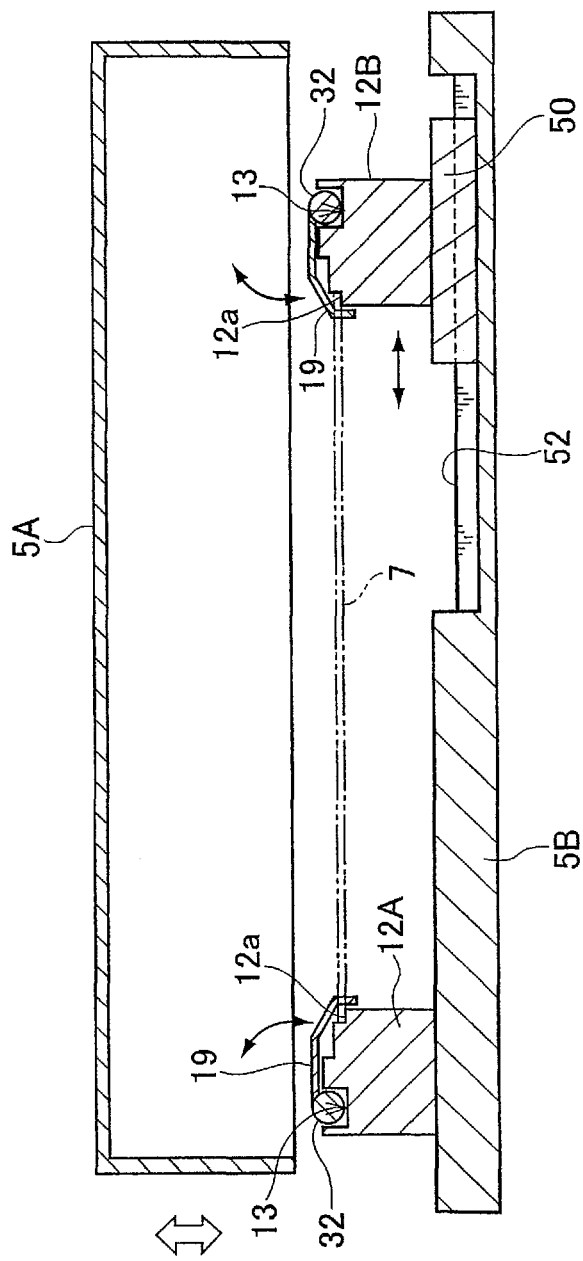
FIG. 2 is a longitudinal sectional view showing a decompression chamber and shows an open condition of the decompression chamber.

Referring to FIG. 2, the reflow process is continued also in the next second reflow chamber 3B. The second reflow chamber 3B is provided with the decompression chamber 5. The decompression chamber 5 is substantially composed of an upper-side housing 5A and a lower-side base 5B, and the lower-side base 5B is positioned in a fixed manner in the reflow chamber 3B. In contrast to this, the upper-side housing 5A can move up and down through the use of an actuator, specifically, a cylinder device (not shown). The upper-side housing 5A descends and can assume a sealed condition in which the upper-side housing 5A is in tight contact with the lower-side base 5B (see FIG. 1). The upper-side housing 5A ascends and can assume an open condition in which the upper-side housing 5A is positioned with a gap above the lower-side base 5B (see FIG. 2).

In an open condition in which the upper-side housing 5A is positioned with a gap above the lower-side base 5B in the decompression chamber 5, the substrate 7 is conveyed by the first conveyance device 14A from the first reflow chamber 3A into the decompression chamber 5 in the second reflow chamber 3B. Subsequently, the decompression chamber 5 comes to a sealed condition. The decompression chamber 5 in a sealed condition is evacuated. As a result of this decompression process, the cream solder on the substrate 7 is degassed. This decompression process is performed for a given time. That is, because of the presence of the atmosphere gas in the second reflow chamber 3B heated by the heater 16, the soldered portion on the substrate 7 maintains the molten condition thereof. And the decompression chamber 5 in the second reflow chamber 3B is brought into a sealed condition after the receiving of the substrate 7 in an open condition. The pressure in the decompression chamber 5 is reduced by a vacuum pump (not shown) to a prescribed decompressed atmosphere at which the soldered portion on the substrate 7 is degassed in a sealed condition. The molten soldered portion on the substrate 7 is degassed by reducing the pressure of the decompression chamber 5.

When the decompression process is completed, the decompression chamber 5 comes to an open condition. The substrate 7 for which decompression treatment has come to an end, is fed by the second conveyance device 14B from the second reflow chamber 3B (the decompression chamber 5) into the cooling chamber 4. The cooling chamber 4 is a chamber for cooling the substrates 7. In this cooling process, the substrate 7 is cooled by a cooling device 17 for a given time and the soldered portion on the substrate 7 is solidified. After that, the substrate 7 is conveyed out of the cooling chamber 4 to the outside through the exit 11 of the furnace 1 by the second conveyance device 14B.

Conveyance Device 14:

The first conveyance device 14A and the second conveyance device 14B will be described.

Figure 4:
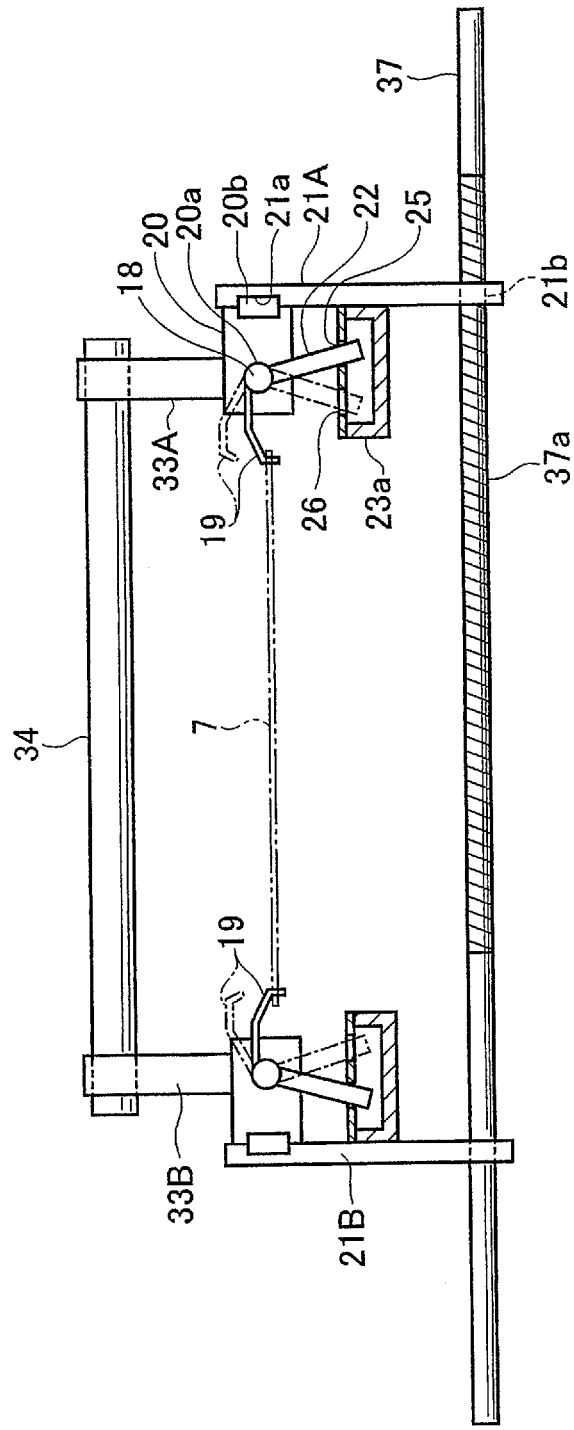
FIG. 4 is a longitudinal sectional view to explain a conveyance device.
Figure 7:
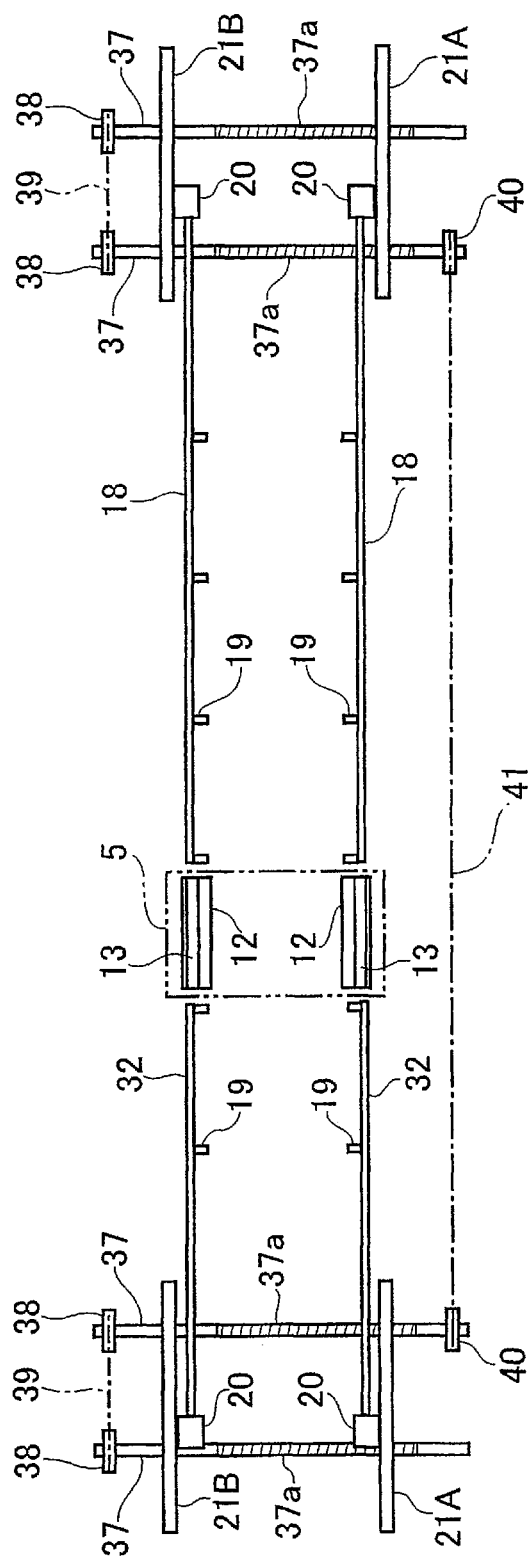
FIG. 7 is a plan view showing moving mechanisms of a first conveyance rod and a second conveyance rod.

First Conveyance Device 14A:

First, the first conveyance device 14A will be described. Referring to FIGS. 1, 4 and 7, a first conveyance rod 18 is arranged on the upstream side of the decompression chamber 5. The first conveyance rod 18 is arranged in a horizontal condition and is capable of reciprocation in the longitudinal direction thereof. The first conveyance rod 18 has four pusher pieces 19 which are arranged at prescribed intervals in the longitudinal direction thereof. The pusher pieces 19 are members which are separate from the first conveyance rod 18 but may also be integrally molded parts. Each of the pusher pieces 19 and the first conveyance rod 18 are of an integral construction and the pusher pieces 19 protrude in the radial direction of the first conveyance rod 18.

The first conveyance rod 18 is configured in that an end portion thereof on the furnace entry 10 side is inserted into a support hole 20a of a rod supporting member 20. The first conveyance rod 18 is supported by the rod supporting member 20 in such a manner as to be capable of axial rotation. The first conveyance rod 18 is incapable of displacement in the longitudinal direction with respect to the rod supporting member 20. The rod supporting member 20 has a guide portion 20b on the outer surface thereof. A support wall 21 is provided in a standing manner on the outer side of the rod supporting member 20. The guide portion 20b of the rod supporting member 20 is fitted into a horizontal guide groove 21a. This guide groove 21a is formed on the inner surface of the support wall 21. The rod supporting member 20 is movable in the horizontal direction while being guided by the guide groove 21a. The first conveyance rod 18 is undisplaceable in the longitudinal direction together with the rod supporting member 20. Therefore, when the rod supporting member 20 moves, the first conveyance rod 18 moves horizontally in the furnace 1 together with the rod supporting member 20 and can convey the substrate 7.

When the first conveyance rod 18 advances in the conveyance direction of the substrate 7 (hereinafter referred to as "moves forward"), the first conveyance rod 18 performs an axial rotation and the pusher piece 19 (see FIG. 4) is positioned in a position (hereinafter referred to as "a pushing position" or "an engagement position") where the pusher piece 19 engages with the rear surface, i.e. an end surface on the delay side in the conveyance direction, of the substrate 7 on the first conveying rail 8. On the other hand, when the first conveyance rod 18 advances in a direction reverse to the conveyance direction of the substrate 7 (hereinafter referred to as "moves backward"), the first conveyance rod 18 performs an axial rotation and the pusher piece 19 is positioned in a position (hereinafter referred to as "a retracted position") where the pusher piece 19 retracts to above the substrate 7. This switching of the pusher piece 19 between a pushing position (an engagement position) and a retracted position is achieved by causing the first conveyance rod 18 to perform an axial rotation at a prescribed angle.

Switching Mechanism for Switching Pusher Piece 19 Between Engagement Position and Retracted Position:

The switching mechanism is composed of a cam mechanism which corresponds to a reciprocating motion of the first conveyance rod 18. This point will be described in detail. The switching mechanism has a guide pole 22 (see FIGS. 1 and 4) whose position is fixed in an end portion of the first conveyance rod 18 on the furnace entry 10 side. The guide pole 22 extends downward from the first conveyance rod 18. The switching mechanism has a guide member 23 (see FIG. 1 and FIGS. 4 to 6) which is arranged in association with the guide pole 22. The guide member 23 is arranged below the guide pole 22. The guide member 23 has a main body 23a which is a box-shaped member. A guide hole 24 is formed in the upper surface of the box-shaped main body 23a. The guide pole 22 protruding from the first conveyance rod 18 is arranged such that a lower end portion thereof is inserted into the guide hole 24.

FIGS. 5(a) and 5(b) are plan views showing the guide members 23. FIG. 5(a) shows a guide member which is on the right side as viewed from the exit side of the furnace to the entry side thereof, and FIG. 5(b) shows a guide member which is on the left side. Referring to FIGS. 5(a) and 5(b), the guide hole 24 is composed of a first guide hole 25 which causes the pusher piece 19 of the first conveyance rod 18 to be arranged in an engagement position, a second guide hole 26 which causes the pusher piece 19 to be arranged in a retracted position, and a coupling guide hole 27 which couples the first and second guide holes 25, 26. The first guide hole 25 and the second guide hole 26 extend linearly along the conveyance direction of the substrate 7. The first and second guide holes 25, 26 extend parallel to each other at an interval. The first and second guide holes 25, 26 are such that the front and the rear thereof, i.e., the front end portion and the rear end portion in the substrate conveyance direction merge with each other by means of the above-described coupling guide hole 27.

Subsequently referring to FIGS. 5(a) and 5(b), the rear end of the first guide hole 25 (the end positioned in the upper part of FIGS. 5(a) and 5(b)) is coupled to the rear end portion of the second guide hole 26 (the end positioned in the upper part of FIGS. 5(a) and 5(b)) by means of the inclined coupling guide hole 27 which extends obliquely and linearly. On the other hand, the front end portion of the first guide hole 25 (the end positioned in the lower part of FIGS. 5(a) and 5(b)) is coupled to the front end of the second guide hole 26 (the end positioned in the lower part of FIGS. 5(a) and 5(b)) by means of the inclined coupling guide hole 27 which extends obliquely and linearly. In this manner, end portions, i.e., front end portions and rear end portions of the first and second guide holes 25, 26 are coupled by the two coupling guide holes 27, 27, whereby the closed-loop guide hole structure 24 is formed. In cooperation with the guide pole 22 guided by the first guide hole 25 and the second guide hole 26, this guide hole structure 24 constitutes the cam mechanism which causes the pusher piece 19 to oscillate between an engagement position and a retracted position.

As described above, the pusher piece 19 assumes an engagement position and a retracted position. The first guide hole 25 functions as a cam groove which causes the pusher piece 19 to be positioned in an engagement position. The substrate 7 on the rail is pushed by the pusher piece 19 by means that the rear end thereof engages with the pusher piece 19. When the first conveyance rod 18 moves forward, the substrate 7 is conveyed from a treatment position to a next treatment position. When this conveyance comes to an end, the first conveyance rod 18 moves backward and returns to an original position. When this first conveyance rod 18 performs a backward movement, the pusher piece 19 is positioned in a retracted position.

When the guide pole 22 is positioned in the first guide hole 25, the pusher piece 19 assumes an engagement position. On the other hand, when the guide pole 22 is positioned in the second guide hole 26, the pusher piece 19 assumes a retracted position. Therefore, when the first conveyance rod 18 moves forward while the guide pole 22 is being guided by the first guide hole 25 (the direction of arrow A of FIG. 5(a)), the pusher piece 19 is positioned in an engagement position (see FIGS. 3(A) to 3(C)) and causes the substrate 7 to move forward while pushing the rear surface of the substrate 7. On the other hand, when the first conveyance rod 18 moves backward while the guide pole 22 is being guided by the second guide hole 26 (the direction of arrow B of FIG. 5(a)), the pusher piece 19 is positioned in a retracted position, which is a position above the substrate 7, so that pusher piece 19 does not interfere with the substrate 7 (see FIGS. 3(A) to 3(C)).

There is the following means so that during the forward movement of the first conveyance rod 18, the guide pole 22 moves forward while being guided by the first guide hole 25, whereas during the backward movement of the first conveyance rod 18, the guide pole 22 moves backward while being guided by the second guide hole 26.

Figure 5:
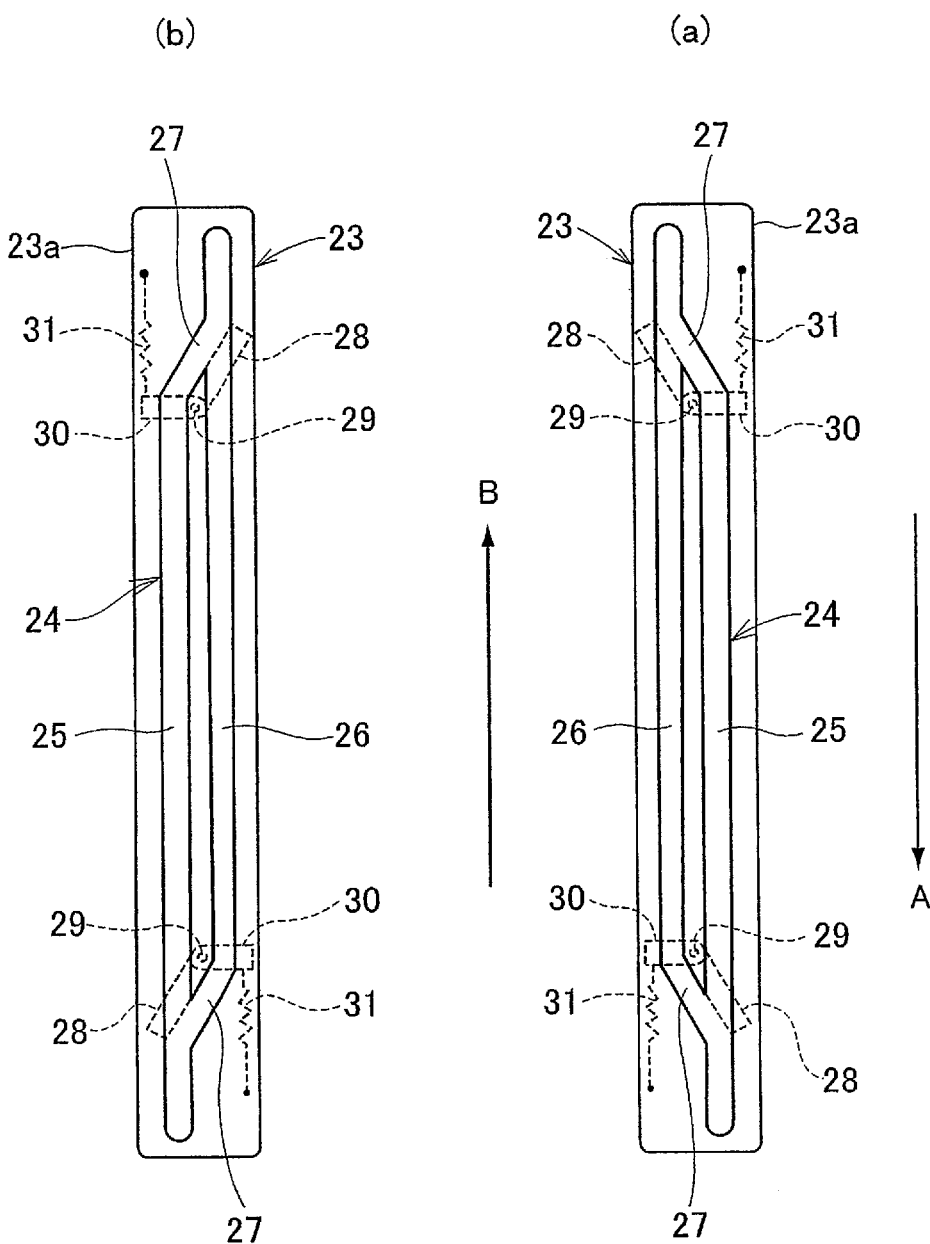
FIGS. 5(a) and 5(b) are plan views showing guide members.
Figure 6:
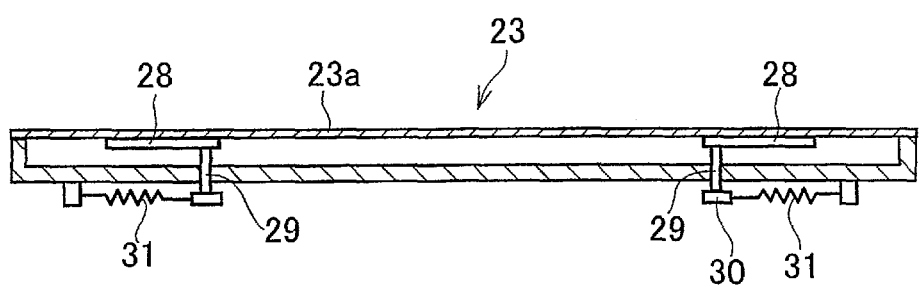
FIG. 6 is a longitudinal sectional view to explain a guide member.

As shown in FIGS. 5(a) and 5(b) and FIG. 6, on the reverse surface of an upper surface portion of the main body 23a of the guide member 23 (FIG. 6), blocking pieces 28 are arranged in both end portions of the closed-loop guide hole 24. One blocking piece 28 is arranged in such a manner as to intersect the first guide hole 25. The other blocking piece 28 is arranged in such a manner as to intersect the second guide hole 26. One end portion of the blocking piece 28 is fixed to a support shaft 29. The support shaft 29 is rotatably arranged between the first guide hole 25 and the second guide hole 26. The support shaft 29 perpendicularly passes through the main body 23a of the guide member 23. A link piece 30 is arranged on the lower surface of a lower surface portion of the main body 23a of the guide member 23. One end portion of the link piece 30 is fixed to the lower end portion of the support shaft 29, and the other end portion is fixed to one end of a return spring 31 formed from a tension spring. The other end of the return spring 31 is fixed to a lower surface portion of the main body 23a of the guide member 23.

As described above, the blocking piece 28 coupled to the link piece 30 via the support shaft 29 is arranged in a height position at which the blocking piece 28 interferes with the guide pole 22. On the other hand, the link piece 30 is arranged in a height position at which the link piece 30 does not interfere with the guide pole 22.

Therefore, during the forward movement of the first conveyance rod 18, the guide pole 22 moves forward while being guided by the first guide hole 25 and when the guide pole 22 advances to the front end portion of the first guide hole 25, the guide pole 22 comes into contact with the first blocking piece 28 shown in the lower part of FIGS. 5(a) and 5(b). When the guide pole 22 moves forward further, the guide pole 22 rotates the first blocking piece 28 against the spring force of the return spring 31. And the guide pole 22 reaches the front end of the first guide hole 25 (the end positioned in the lower part of FIGS. 5(*a*) and 5(*b*)). When the guide pole 22 passes by the first blocking piece 28, the blocking piece 28 returns to an original position by means of the return spring 31. In this process of the forward movement of the first conveyance rod 18, i.e., the process in which the first conveyance rod 18 advances to the lower end shown in the lower part of FIGS. 5(*a*) and 5(*b*) while being guided by the first guide hole 25, as described above, the pusher piece 19 is positioned in an engagement position (see FIG. 2). Therefore, the pusher piece 19 engages with the substrate 7 and pushes forward the substrate 7 by one process, i.e., to an adjacent next process (for example, from the reflow process to the decompression process).

Next, during the backward movement of the first conveyance rod 18, the guide pole 22 moves backward from the front end of the first guide hole 25 while being guided by the first guide hole 25 (moves upward from the lower end of the first guide hole 25 shown in FIGS. 5(*a*) and 5(*b*)), and then the guide pole 22 collides with the blocking piece 28 which is positioned by traversing the first guide hole 25. As will be understood well from FIGS. 5(*a*) and 5(*b*), the blocking piece 28 traverses the first guide hole 25 obliquely. Preferably, the inclination angle of the blocking piece 28 is the same as the inclination angle of the coupling guide hole 27. In FIGS. 5(*a*) and 5(*b*), when the guide pole 22 which moves upward from the lower end of the first guide hole 25 collides with the blocking piece 28, the guide pole 22 enters the inclined coupling guide hole 27 by being guided by an inclined side edge of this blocking piece 28 and then the guide pole 22 moves to the second guide hole 26 via this coupling guide hole 27.

For the first conveyance rod 18, when the guide pole 22 moves backward while being guided by the second guide hole 26, the guide pole 22 comes into contact with a second blocking piece 28 shown in the upper part of FIGS. 5(*a*) and 5(*b*). When the guide pole 22 moves backward further, the guide pole 22 rotates the second blocking piece 28 against the spring force of the return spring 31 which is shown in the upper part of FIGS. 5(*a*) and 5(*b*). Then the guide pole 22 reaches the end of the second guide hole 26 (the upper end of the second guide hole 26 in FIGS. 5(*a*) and 5(*b*)). When the guide pole 22 passes by the second blocking piece 28, the blocking piece 28 returns to an original position by means of the return spring 31. In this process of the backward movement of the first conveyance rod 18, i.e., the process in which the first conveyance rod 18 moves backward while being guided by the second guide hole 26, as described above, the pusher piece 19 is positioned in a retracted position (the broken line in FIG. 4). Therefore, the pusher piece 19 retracts by one process, while being positioned in a retracted position above the substrate 7, so that the pusher piece 19 does not interfere with the substrate 7.

Next, for the first conveyance rod 18, when the guide pole 22 moves forward while being guided by the second guide hole 26 (descends from the upper end of the second guide hole 26 in FIGS. 5(*a*) and 5(*b*), the guide pole 22 collides with the blocking piece 28 which is positioned by traversing the second guide hole 26. As will be understood well from FIGS. 5(*a*) and 5(*b*), the blocking piece 28 which is shown in the upper part of FIGS. 5(*a*) and 5(*b*) traverses the second guide hole 26 obliquely. Preferably, the inclination angle of the blocking piece 28 is the same as the inclination angle of the coupling guide hole 27. In FIGS. 5(*a*) and 5(*b*), when the guide pole 22 which moves downward from the upper end of the second guide hole 26 collides with the blocking piece 28, the guide pole 22 enters the inclined coupling guide hole 27 by being guided by an inclined side edge of this blocking piece 28 and then the guide pole 22 moves to the first guide hole 25 via this coupling guide hole 27. That is, the guide pole 22 is guided by the blocking piece 28 having a side edge which is inclined in the direction in which the guide pole 22 advances, and this guide pole 22 enters the coupling guide hole 27. This coupling guide hole 27 is inclined in the direction in which the guide pole 22 advances, and the guide pole 22 enters the first guide hole 25 by being guided by this inclined coupling guide hole 27. Thereafter, the actions described above are repeated.

As described above, with a single reciprocating action (a forward movement and a backward movement) of the first conveyance rod 18, it is possible to convey the substrate 7 by one process, i.e., to a next process. The inclined coupling guide hole 27 may be a straight line shape as described above or may be curved a little.

A plurality of pusher pieces 19 corresponding to each of a plurality of processes are fixed to the first conveyance rod 18 (FIG. 3(A) to 3(D)). According to this structure, it is possible to feed substrates 7 forward one after another by one forward movement action of the first conveyance rod 18. That is, a substrate 7 positioned in a position adjacent to the entry 10 of the reflow furnace 1 is conveyed into the first preliminary heating chamber 2A (the preliminary heating process), a substrate 7 positioned in the first preliminary heating chamber 2A is conveyed into the next preliminary heating chamber 2B (the preliminary heating process), a substrate 7 positioned in the preliminary heating chamber 2B is conveyed into the reflow chamber 3A (the reflow process), and a substrate 7 positioned in the reflow chamber 3A is fed into the decompression chamber 5 (the decompression chamber) by the first conveyance rod 18.

When the first conveyance rod 18 has advanced, the front end portion of the first conveyance rod 18 enters the decompression chamber 5 a little.

Second Conveyance Device 14B:

Next, the second conveyance device 14B will be described. The second conveyance device 14B has a configuration similar to that of the first conveyance device 14A. That is, a second conveyance rod 32 (see FIGS. 1 and 7) constituting the second conveyance device 14B is horizontally arranged in the interior of the reflow furnace 1. The second conveyance rod 32 is positioned on the downstream side including the decompression chamber 5. Two pusher pieces 19 are fixed to the second conveyance rod 32 at an interval in the longitudinal direction thereof. Each of the pusher pieces 19 protrudes in the radial direction of the second conveyance rod 32. As with the first conveyance rod 18, also the second conveyance rod 32 is supported by the rod supporting member 20 in such a manner as to be incapable of displacement in the longitudinal direction and be capable of axial rotation. The rod supporting member 20 is configured in such a manner as to be capable of moving horizontally while being guided by a guide groove of a support wall. Therefore, the second conveyance rod 32 is capable of moving horizontally in the furnace 1 in the conveyance direction of the substrate 7 in association with the displacement of the rod supporting member 20.

Also for the second conveyance rod 32, with the help of the same mechanism as the above-described switching mechanism provided in the first conveyance rod 18, when the second conveyance rod 32 moves forward, the second conveyance rod 32 performs an axial rotation so that the pusher 19 is positioned in a position in which the pusher 19 pushes the rear surface of the substrate 7 on the conveying rail 9 (an engagement position). When the second conveyance rod 32 moves backward, the second conveyance rod 32 performs an axial rotation so that the pusher 19 is positioned in a position in which the pusher piece 19 retracts to above the substrate 7 (a retracted position). With a single reciprocating action (a forward movement and a backward movement) of the second conveyance rod 32, the substrate 7 is conveyed to a next process. That is, the second conveyance rod 32 enters the decompression chamber 5 by the backward movement thereof. And by the forward movement thereof, the second conveyance rod 32 conveys a substrate 7 positioned in the decompression chamber 5 into the cooling chamber 4 (the cooling process), and conveys a substrate 7 positioned in the cooling chamber 4 (the cooling process) out of the exit 11 of the furnace 1 to the outside.

As shown in FIG. 4, the first conveyance rod 18 having the pusher piece 19 and the switching mechanism are provided in a pair in the right and left parts of the conveyance path in such a manner as to push the right and left end portions of the substrate 7, and upright members 33 which are planted on the upper surfaces of the right and left rod supporting members 20 are coupled by a coupling rod 34 so that the right and left first conveyance rods 18 go into action in conjunction with each other. The second conveyance rod 32 is similarly configured.

Synchronization Mechanism of First and Second Conveyance Rods 18, 32 (FIG. 1):

Next, means for causing the first conveyance rod 18 and the second conveyance rod 32 to perform a reciprocating motion (a forward movement and a backward movement) will be described. As shown in FIG. 1, a chain conveyor 35 is disposed outside the exit 11 side of the furnace 1. The chain conveyor 35 is arranged horizontally and in parallel in the conveyance direction of the substrate 7. The rod supporting member 20 of the second conveyance rod 32 is fixed to the chain portion of this chain conveyor 35. The rod supporting member 20 of the first conveyance rod 18 and the rod supporting member 20 of the second conveyance rod 32 are coupled by a coupling rod 36. The coupling rod 36 is arranged on the outer side of the decompression chamber 5 in such a manner as to pass through the interior of the furnace 1.

When the chain conveyor 35 performs a forward rotation at a prescribed angle in the direction of arrow A of FIG. 1, the first conveyance rod 18 and the second conveyance rod 32 move forward over a prescribed distance (corresponding to one process). When the chain conveyor 35 performs a reverse rotation at a prescribed angle in the direction of arrow B of FIG. 1, the first conveyance rod 18 and the second conveyance rod 32 move backward over the prescribed distance (corresponding to one process). In this manner, the first conveyance rod 18 and the second conveyance rod 32 perform a reciprocating motion over the prescribed distance (corresponding to one process) when the chain conveyor 35 is rotated at a prescribed angle in forward and reverse directions.

Referring to FIGS. 3(A) to 3(D), actions of the first and second conveyance devices 14A, 14B will be described below. FIG. 3(A) shows the condition in which a substrate 7 is arranged in each process and that the substrate 7 is treated in each process for a given time. FIGS. 3(B) to 3(D) show the condition in which the substrate 7 is moved to a next process after the treatment of the substrate 7 is performed for a given time in the condition of FIG. 3(A).

In FIG. 3(C), the first conveyance rod 18 and the second conveyance rod 32 are each in the following condition. That is, for the first conveyance rod 18, the pusher pieces 19 are in a pushing position (an engagement position), and the pusher pieces 19 are positioned on the upstream side of the substrates 7 which are respectively positioned on the front side, i.e. upstream side, of the reflow chamber 3A (the reflow process), the preliminary heating chamber 2B (the preliminary heating process), the preliminary heating chamber 2A (the preliminary heating process), and the entry of the furnace 1. For the second conveyance rod 32, the pusher pieces 19 are in a pushing position (an engagement position), and the pusher pieces 19 are respectively arranged at the front of the substrates 7 in the decompression chamber 5 (the decompression process) and the cooling chamber 4 (the cooling process).

When the first conveyance rod 18 and the second conveyance rod 32 move forward with the guide pole 22 guided by the first guide hole 25 from the condition of FIG. 3(C) by the forward rotation of the chain conveyor 35 (arrow A of FIG. 1), then as shown in FIG. 3(C)→FIG. 3(D), the substrate 7 in each process is fed by the pusher piece 19 to a next process.

That is, by means of the first conveyance rod 18, the substrate 7 arranged at the front of the entry 10 of the furnace 1 is fed into the first preliminary heating chamber 2A (the preliminary heating process), the substrate 7 in the first preliminary heating chamber 2A is fed into the next preliminary heating chamber 2B (the preliminary heating process), the substrate 7 in the preliminary heating chamber 2B is fed into the reflow chamber 3A (the reflow process), and the substrate 7 in the reflow chamber 3A is fed into the decompression chamber 5 (the decompression process). Also by means of the second conveyance rod 32, the substrate 7 in the decompression chamber 5 is fed into the cooling chamber 4 (the cooling process), and the substrate 7 in the cooling chamber 4 is conveyed out of the exit 11 of the furnace 1 to the outside.

Next, by the reverse rotation of the chain conveyor 35 (arrow B of FIG. 1), the condition of the first conveyance rod 18 and the second conveyance rod 32 is changed from the condition of FIG. 3(D) to the condition of FIG. 3(A). That is, when the first conveyance rod 18 and the second conveyance rod 32 move backward, the guide pole 22 enters the second guide hole 26, while being guided by the coupling guide hole 27, and the pusher piece 19 is arranged in a retracted position.

In FIG. 3(A), the first conveyance rod 18 and the second conveyance rod 32 are each in the following condition. That is, the first conveyance rod 18 and the second conveyance rod 32 are arranged on the outer side of the decompression chamber 5, each pusher piece 19 is in a retracted position, and the pusher pieces 19 at the head of each of the rods 18, 32 are arranged in positions on both sides of the decompression chamber 5. In this condition, substrates 7 are treated in each process for a given time.

When the treatment of substrates 7 is performed in each process for a given time in the condition of FIG. 3(A), the first conveyance rod 18 and the second conveyance rod 32 move backward by the reverse rotation of the chain conveyor 35 and then the condition of the first conveyance rod 18 and the second conveyance rod 32 changes from the condition of FIG. 3(A) to the condition of Figure (B). That is, the first conveyance rod 18 and the second conveyance rod 32 move backward over a distance corresponding to almost one process, while the guide pole 22 is being guided by the second guide hole 26, with the pusher pieces 19 arranged in a retracted position.

Figure 3:
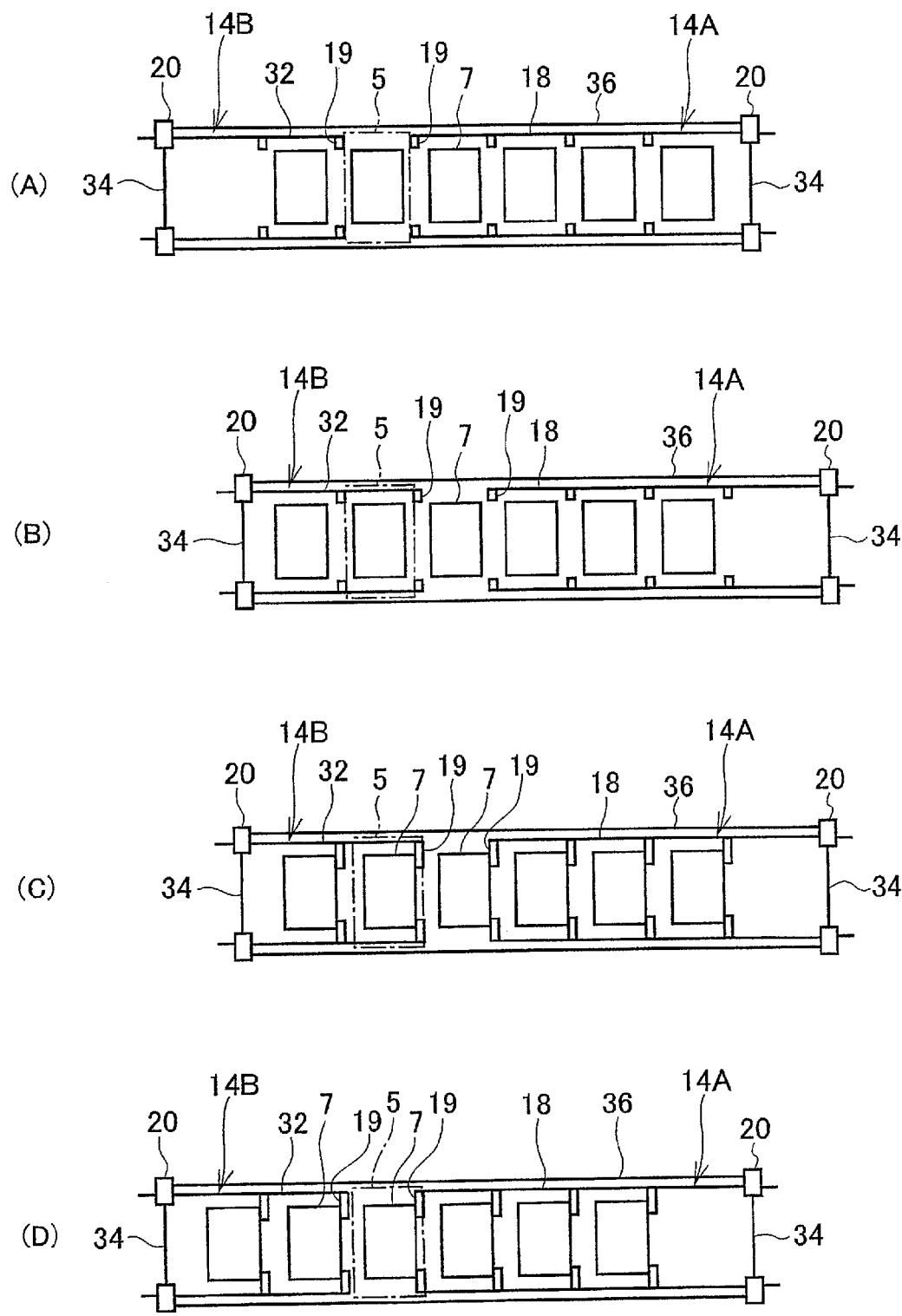
FIGS. 3(A) to 3(D) are diagrams to explain actions of a conveyance device.

In FIG. 3 (B), the first conveyance rod 18 and the second conveyance rod 32 are each in the following condition. That is, for the first conveyance rod 18, the pusher pieces 19 are in a retracted position, and the pusher pieces 19 are positioned respectively at the fronts of the substrates 7 which are positioned at the fronts of the reflow chamber 3A (the reflow process), the preliminary heating chamber 2B (the preliminary heating process), the preliminary heating chamber 2A (the preliminary heating process), and the entry of the furnace 1. For the second conveyance rod 32, the pusher pieces 19 are in a retracted position, and the pusher pieces 19 are positioned respectively on the rear end sides of the substrates 7 of the decompression chamber 5 (the decompression process) and the cooling chamber 4 (the cooling process)

Next, by the forward rotation of the chain conveyor 35, the condition of the first conveyance rod 18 and the second conveyance rod 32 is changed from the condition of FIG. 3(B) to the condition of FIG. 3(C). That is, when the first conveyance rod 18 and the second conveyance rod 32 move forward, the guide pole 22 enters the first guide hole 25, while being guided by the coupling guide hole 27, and then the pusher pieces 19 are arranged in a pushing position (an engagement position). Thus, a change to the condition of Figure (C) is made. And from this condition of FIG. 3(C), the above-described actions are repeated; with a single reciprocating action (a forward movement and a backward movement) of the first conveyance rod 18 and the second conveyance rod 32, the substrate 7 is fed to a next process, one step at a time, and the substrate 7 is treated in each process for a given time.

For the decompression chamber 5, the substrate 7 is conveyed by the first conveyance device 14A into the decompression chamber 5, and on the other hand the substrate 7 is conveyed by the second conveyance device 14B out of the decompression chamber 5.

Therefore, printed circuit boards 7 on which electronic parts are mounted are conveyed one by one by the first and second conveyance devices 14A, 14B from positions on the upstream side of the entry 10 of the furnace 1 through each process in the furnace 1, including the decompression process, and are treated in each process for a given time, and the substrates 7 on which electronic parts are soldered are conveyed out of the exit 11 of the furnace 1.

Note that actions of the first conveyance rod 18 and the second conveyance rod 32 are performed according to a sequence which is set beforehand, by the control of a driving motor for the chain conveyor 35.

Adjustment of Spacing Between Right and Left Rail Portions 12a, 12a of Decompression Chamber 5:

Referring to FIG. 2, one substrate supporting member 12A out of the right and left substrate supporting members 12 arranged in the interior of the decompression chamber 5 is fixed to the lower-side base 5B. The other substrate supporting member 12B is fixed to a slider 50. The slider 50 is capable of moving by means of two guides 52 formed on the lower-side base 5B. The movement direction is a direction orthogonal to the conveyance direction of the substrate 7. That is, the other substrate supporting member 12B is capable of displacement in a direction traversing the conveyance direction of the substrate 7, that is, capable of departing from and approaching one substrate supporting member 12A. Therefore, by causing the other substrate supporting member 12B to move, it is possible to adjust the spacing between the right and left substrate supporting members 12A, 12B.

The adjustment of the spacing between the right and left substrate supporting members 12A, 12B of the decompression chamber 5, i.e., the adjustment of the spacing between the right and left rail portions 12a, 12a of the decompression chamber 5 is performed during the adjustment of the spacing between the first conveying rail 8 positioned on the upstream side of the decompression chamber 5 and the second conveying rail 9 positioned on the downstream side of the decompression chamber 5. This rail spacing adjustment (the adjustment of the spacing between a pair of rails) is performed in a preparatory stage for treating substrates 7 having different widths.

Figure 8:
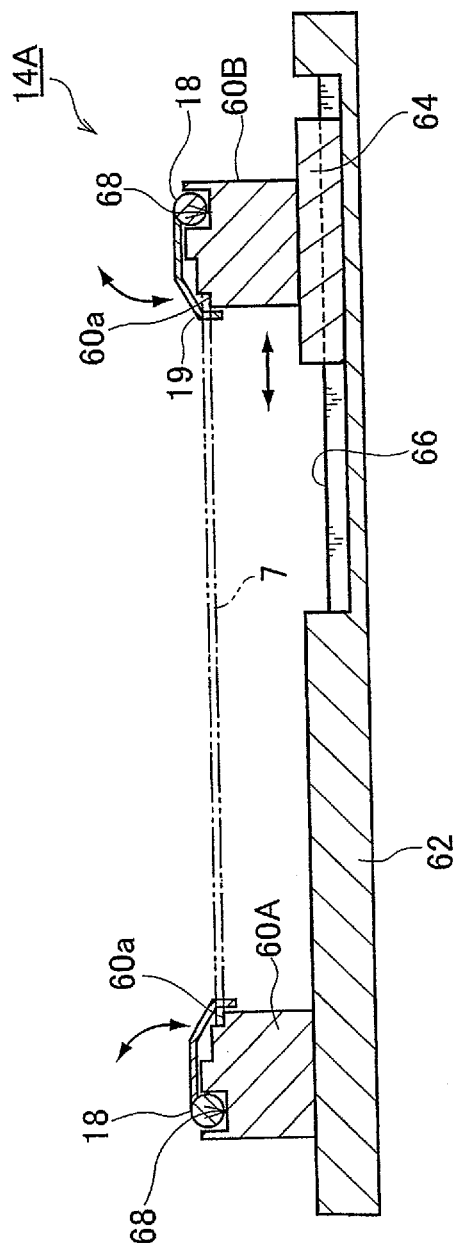
FIG. 8 is a sectional view to explain an upstream-side guide member which constitutes a first conveying rail positioned on the upstream side of the decompression chamber.

Width Adjustment of First Substrate Conveying Rail 8:

FIG. 8 shows an upstream-side guide member 60 which constitutes the first conveying rail 8. The upstream-side guide member 60 has substantially the same configuration as that of the above-described base supporting member 12 of the decompression chamber 5. That is, one upstream-side guide member 60A out of the upstream-side guide members 60 is fixed to a lower-side base 62. The other upstream-side guide member 60B is fixed to a slider 64. The slider 64 is capable of moving by means of two guides 66 formed on the lower-side base 62. The movement direction is a direction orthogonal to the conveyance direction of the substrate 7, i.e., the width direction of the substrate 7. That is, the other upstream-side guide member 60B is capable of displacement in a direction traversing the conveyance direction of the substrate 7, i.e., the width direction of the substrate 7. In other words, the other upstream-side guide member 60B is capable of relatively departing from and approaching one upstream-side guide member 60A. Therefore, by causing the other upstream-side guide member 60B to move, it is possible to adjust the spacing between the right and left upstream-side guide members 60A, 60B. Needless to say, both of the right and left upstream-side guide members 60A, 60B may be configured in such a manner as to be capable of displacement so that the right and left upstream-side guide members 60A, 60B can depart from and approach each other.

The right and left upstream-side guide members 60A, 60B are configured in that stepped portions are formed in upper surface end portions thereof which are opposed to each other, that a horizontal rail portion 60a along the conveyance path is formed by the stepped portion, and that right and left end portions of the lower surface of the substrate 7 are supported by these rail portions 60a, 60a. That is, the right and left rail portions 60a, 60a substantially constitute the first substrate conveying rail 8. On upper surfaces of the upstream-side guide members 60A, 60B, concave grooves 68 which receive the first conveyance rod 18 are formed along the conveyance path of the substrate 7 and along the full length of the right and left upstream-side guide members 60A, 60B. The first conveyance rod 18 inserted into the concave grooves 68 is capable of displacement in the longitudinal direction thereof but is incapable of displacement in the transverse direction.

Figure 9:
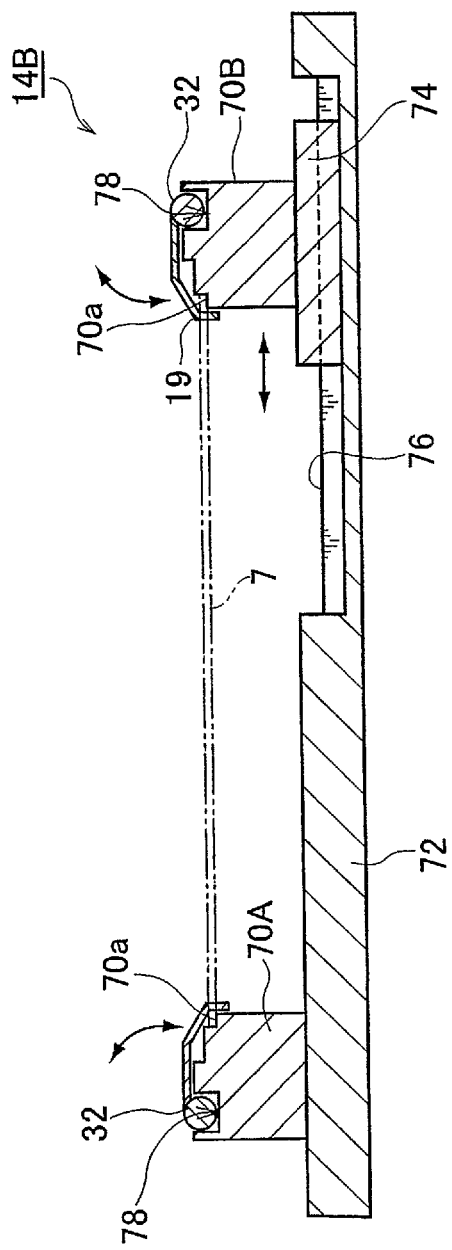
FIG. 9 is a sectional view to explain a downstream-side guide member which constitutes a second conveying rail positioned on the downstream side of the decompression chamber.

Width Adjustment of Second Substrate Conveying Rail 9:

FIG. 9 shows a downstream-side guide member 70 which constitutes the second conveying rail 9. The downstream-side guide member 70 has substantially the same configuration as those of the base supporting member 12 of the decompression chamber 5 and the upstream-side guide member 60, which were described above. That is, one downstream-side guide member 70A out of the downstream-side guide members 70 is fixed to a lower-side base 72. The other downstream-side guide member 70B is fixed to a slider 74. The slider 74 is capable of moving by means of two guides 76 formed on the lower-side base 72. The movement direction of the slider 74 is a direction orthogonal to the conveyance direction of the substrate 7, i.e., the width direction of the substrate 7. That is, the other downstream-side guide member 70B is capable of displacement in a direction traversing the conveyance direction of the substrate 7, i.e., the width direction of the substrate 7. In other words, the other downstream-side guide member 70B is capable of departing from and approaching one downstream-side guide member 70A. Therefore, by causing the other downstream-side guide member 70B to move, it is possible to adjust the spacing between the right and left downstream-side guide members 70A, 70B. Needless to say, both of the right and left downstream-side guide members 70A, 70B may be configured in such a manner as to be capable of displacement so that the right and left downstream-side guide members 70A, 70B can depart from and approach each other.

The right and left downstream-side guide members 70A, 70B are configured in that stepped portions are formed in upper surface end portions thereof which are opposed to each other, that a horizontal rail portion 70a along the conveyance path is formed by the stepped portion, and that right and left end portions of the lower surface of the substrate 7 are supported by the right and left rail portions 70a, 70a. That is, the right and left rail portions 70a, 70a substantially constitute the second substrate conveying rail 9. On upper surfaces of the right and left downstream-side guide members 70A, 70B, concave grooves 78 which receive the second conveyance rod 32 are formed along the conveyance path of the substrate 7 and along the full length of the downstream-side guide members 70A, 70B. The second conveyance rod 32 inserted into the grooves 78 is capable of displacement in the longitudinal direction thereof but is incapable of displacement in the transverse direction thereof.

In the case where substrates 7 having different widths are subjected to reflow treatment, the width adjustment of the right and left guide members 60, 70 constituting each of the first and second substrate conveying rails 8, 9 is performed as preparations for starting this reflow treatment. That is, the first and second substrate conveying rails 8, 9 arranged in front of and behind the decompression chamber 5 are configured in such a manner that the spacing between the right and left guide members, i.e., the width of the first and second conveying rails 8, 9 can be changed according to widths of the substrate 7. And accompanying with this change, the spacing between a pair of right and left substrate supporting members 12A, 12B (the right and left rail portions 12a) in the decompression chamber 5 is adjusted. This point will be described later.

One first conveyance rod 18 out of the two right and left first conveyance rods 18 provided in a pair is capable of moving in the width direction of the substrate 7. The position of the other first conveyance rod 18 is fixed. Similarly, one second conveyance rod 32 out of the two right and left second conveyance rods 32 provided in a pair, positioned on the same side as the above-described movable first conveyance rod 18 is capable of moving in the width direction of the substrate 7. The position of the other second conveyance rod 32 positioned on the same side as the above-described other first conveyance rod 18 is fixed.

Mechanism for Moving First and Second Conveyance Rods 18, 32 in Width Direction of Substrate 7:

Next, a description will be given of a mechanism for moving the first conveyance rod 18 and the second conveyance rod 32 in the width direction of the substrate 7, i.e., a mechanism for moving the first conveyance rod 18 and the second conveyance rod 32 in a direction traversing the substrate conveying path.

Referring to FIG. 7, feed screw rods 37 are attached in a piercing manner to the right and left support walls 21 by which the first conveyance rod 18 is supported. The feed screw rod 37 is configured in that a male screw 37a is formed in part of the circumference thereof. This male screw 37a is screwed to a female screw hole 21b formed on one support wall (a movable support wall) 21A. The non-threaded portion of the feed screw rod 37 is supported in such a manner as to be rotatable in a through hole formed in the other support wall (a position-fixed support wall) 21B. The feed screw rod 37 is provided between the right and left support walls 21 along the conveyance path of the substrate 7 in a pair in spaced back-and-forth relation. One feed screw rod 37 for driving is configured in such a manner as to be rotatably driven by a motor (not shown). Sprockets 38 are respectively attached to end portions of the pair of feed screw rods 37, and a chain 39 is laid across these sprockets 38.

Also between the right and left support walls 21A, 21B by which the second conveyance rod 32 is supported, in the same manner as the first conveyance rod 18 side, feed screw rods 37 are provided in a pair in back-and-forth relation, and a chain 39 is laid across the sprockets 38 in a bridging manner.

A sprocket 40 is attached to the feed screw rod 37 for being driven on the first conveyance rod 18 side and another sprocket 40 is attached to the other end portion of one feed screw rods 37 of the second conveyance rod 32, and a chain 41 is laid across these in a bridging manner.

Therefore, when the feed screw rod 37 for driving on the first conveyance rod 18 side is rotated by a motor, the other feed screw rod 37 is rotated by chain drive and, at the same time, also the pair of feed screw rods 37 on the second conveyance rod 32 side is rotatably driven. As a result, the movable support wall 21A undergoes displacement in the width direction of the substrate 7 and the spacing between the movable support wall 21A and the position-fixed support wall 21B changes. Although chain drive was adopted as the drive means, it is needless to say that the drive means is not limited to this.

As described above, when the feed screw rod 37 on the first conveyance rod 18 side and the feed screw rod 37 on the second conveyance rod 32 side rotate, the movable support wall 21A associated with the first conveyance rod 18 and the movable support wall 21A associated with the second conveyance rod 32 undergo displacement in the width direction of the substrate 7. Thus, it is possible to adjust the spacing between the first right and left conveyance rods 18 and the spacing between the second right and left conveyance rods 32.

Referring to FIG. 4, although the coupling rod 34 which is provided between the right and left upright members 33A, 33B, which are provided on the right and left rod supporting members 20, is arranged such that one end portion thereof is fixed to one upright member 33B, the other end portion of the coupling rod 34 is loosely fitted to the other upright member 33A and this other upright member 33A and the coupling rod 34 are capable of moving relatively.

Adjustment of Spacing Between Right and Left Rail Portions 60a, 60a, 70a, 70a Respectively Constituting of First and Second Substrate Conveying Rails 8, 9:

As described above, the spacing between the right and left upstream-side guide members 60A, 60B, which substantially constitute the first conveying rail 8, is adjustable. And the rail portion 60a is formed in each of the right and left upstream-side guide members 60A, 60B which have the concave grooves 68 for receiving the first conveyance rod 18.

Similarly, the spacing between the right and left downstream-side guide members 70A, 70B which substantially constitute the second conveying rail 9 is adjustable. And the rail portion 70a is formed in each of the right and left downstream-side guide members 70A, 70B which have the concave grooves 78 for receiving the second conveyance rod 32.

Therefore, when the width adjustment of the first conveyance rod 18 is made, that is, the spacing between the two first conveyance rods 18, 18 provided in a pair is adjusted, as a consequence of this, the spacing between the two first conveying rails 8, 8 provided in a pair is adjusted. When the spacing between the two second conveyance rods 32, 32 provided in a pair is adjusted, as a consequence of this, the spacing between the two second conveying rails 9, 9 provided in a pair is adjusted.

Because the first conveyance rod 18 and the second conveyance rod 32 move in response to each other, the spacing adjustment of the first substrate conveying rails 8, 8 (the width adjustment of the first substrate conveying rail 8) and the spacing adjustment of the two second substrate conveying rails 9, 9 (the width adjustment of the second substrate conveying rail 9) are performed in synchronization with each other.

As an example of a variation, it is possible to adopt a configuration in which a drive mechanism for adjusting the spacing between the first substrate conveying rails 8, 8 is provided and a drive mechanism for adjusting the spacing between the second substrate conveying rails 9, 9 is provided, and in accompanying with these mechanism, the spacing adjustment between the first conveyance rods 18, 18 and the spacing adjustment between the second conveyance rods 32, 32 are performed.

Procedure for Adjustment of Spacing Between Right and Left Rail Portions 12a, 12a in Decompression Chamber 5:

As preparations for the treatment of substrates 7 having different widths, in such a manner as to adapt to the width of substrates 7 to be treated next, the width adjustment of the first and second substrate conveying rails 8, 9 and the width adjustment of the rail portions 12a in the decompression chamber 5 are performed by following the procedures described below.

(1) The first conveyance rod 18 is positioned in a retracted position (FIG. 10(I)).

(2) The second conveyance rod 32 is positioned in a retracted position. When the second conveyance rod 32 is in a retracted position, the rear end portion of the second conveyance rod 32 has entered the interior of the decompression chamber 5 (FIG. 10(I)).

(3) The width adjustment of the first and second conveyance rods 18, 32 is performed. With this width adjustment of the first and second conveyance rods 18, 32, the width adjustments of the first substrate conveying rail 8 and the second substrate conveying rail 9 are completed (FIG. 10(II)).

(4) According to the width adjustment of the second conveyance rod 32 included in (3) above, the spacing between the right and left rail portions 12a, 12a of the decompression chamber 5 is adjusted.

(5) The first and second conveyance rods 18, 32 are positioned in a retracted position.

Adjustment of Spacing Between Right and Left Rail Portions 12a, 12a of Decompression Chamber 5 in Ordinary Operation of Reflow Furnace 1:

In the process of conveyance of the substrate 7, as described above, the first conveyance rod 18 enters the decompression chamber 5 a little when the first conveyance rod 18 moves forward. And the second conveyance rod 32 enters the decompression chamber 5 a little when the second conveyance rod 32 moves backward. Therefore, during the operation of the reflow furnace 1, the spacing of the right and left rail portions 12a, 12a (the substrate supporting members 12A, 12B) in the decompression chamber 5 is constantly adjusted by the first and second conveyance rods 18, 32 to ensure a regular spacing thereof.

The reflow furnace 1 of the embodiment has been described above. Because it is necessary only that the concave groove 13 be formed in the substrate supporting member 12 in the interior of the reflow furnace 1 of the embodiment, it is possible to easily configure the construction of the interior of the decompression chamber 5 and maintenance is also easy. Furthermore, because it is possible to reduce the size of the decompression chamber 5, it is possible to shorten the time necessary for producing a reduced-pressure atmosphere.

Although the above-described embodiment is configured such that the first conveyance rod 18 positioned on the upstream side and the second conveyance rod 32 positioned on the upstream side, with the decompression chamber 5 sandwiched therebetween, are moved together by the chain conveyor 35, the first conveyance rod 18 and the second conveyance rod 32 may be individually driven.

In the case where the first conveyance rod 18 and the second conveyance rod 32 are individually driven, it is possible to adopt a configuration in which the spacing of the rail portions 12a, 12a (the substrate supporting members 12A, 12B) in the decompression chamber 5 is adjusted by the first conveyance rod 18.

That is, it is possible to adopt a following configuration in which for the first conveyance rod 18 and the second conveyance rod 32, the rod supporting members 20 thereof are separated without being coupled by means of the coupling rod, a chain conveyor which drives the first conveyance rod 18 is provided on the entry side of the furnace 1 and a chain conveyor which drives the second conveyance rod 32 is provided on the exit side of the furnace 1.

Although the guiding of the guide pole 22 in the switching mechanism is performed using the guide hole 24 as an explanatory example in the above-described embodiment, this guiding is not limited to this configuration. For example, this guiding may be performed through the use of a guide groove. The switching mechanism of the pusher member capable of switching between a pushing position and a retracted position is not limited to the switching mechanism described in the above-described embodiment.

In the above-described embodiment, the first conveyance device 14A has the first right and left conveyance rods 18 and that the second conveyance device 14B has the second right and left conveyance rods 32. Instead of this, the first conveyance rod 18 and the second conveyance rod 32 each may be composed of one rod.

Although in the above-described embodiment a chain conveyor is used as the drive means which causes the first conveyance rod 18 and the second conveyance rod 32 to perform a reciprocating motion, the drive means is not limited to this.

Although the width of the first substrate conveying rail 8 and the second substrate conveying rail 9 is adjusted by adjusting the width of the first conveyance rod 18 and the second conveyance rod 32 in the above-described embodiment, a mechanism for directly adjusting the width of the first substrate conveying rail 8 and the second substrate conveying rail 9 may be provided.

Although out of the first right and left conveyance rods 18, the second right and left conveyance rods 32, and the right and left substrate supporting members 12, one is capable of moving relatively in the width direction of the substrate 7 with respect to the other as an explanatory example in the above-described embodiment, it is possible to adopt a configuration in which both of members which constitute a pair are capable of moving in the width direction of the substrate 7.

Although the decompression chamber is provided in the interior of the reflow chamber as an explanatory example in the above-described embodiment, the decompression chamber may be arranged in the middle of the conveyance path (an area other than the reflow chamber).

Although nitrogen gas is used as the gas in the furnace as an explanatory example in the above-described embodiment, the gas is not limited to nitrogen gas. For example, air may sometimes be used.

The present invention is not limited to a reflow furnace which welds electronic parts on a substrate. The present invention is related to a heat processing furnace having a treatment section on a conveyance path where an object to be treated (a workpiece) is conveyed. In the treatment section, the workpiece is subjected to treatment under the condition that the conveyance of a workpiece is stopped. This treatment section may be configured as an openable and closable chamber. The opening and closing of the treatment chamber may be performed by means of a door, or as in the above-described embodiment, an open condition and a closed condition may be respectively produced by ensuring that the upper-side housing (the first housing) and the lower-side housing (the second housing) depart from and approach each other relatively.

As an example related to the treatment section, it is possible to adopt a configuration in which the treatment section has, for example, a turntable and the direction of the workpiece is changed in a horizontal plane on this turntable. The treatment section provided on the above-described conveyance path may be capable of moving in a direction in which the treatment section moves away from the conveyance path in a transverse direction as viewed from the plane.

The invention claimed is:

1. A heat processing device having a treatment section sandwiched between a first conveyance apparatus positioned on an upstream side of the treatment section and a second conveyance apparatus positioned on a downstream side of the treatment section, comprising:

right and left support members provided in the treatment section in rightward and leftward spaced relation for supporting an object to be treated, at least either of the right and left support member being free to move in the transverse direction of the treatment section, at least one first conveyance rod arranged in the first conveyance apparatus and capable of a reciprocating motion in a longitudinal direction of the first conveyance apparatus for conveying the object to the treatment section, a pair of first conveying rail members provided in the first conveyance apparatus for supporting the object, at least either of the first conveying rail members being movable in the width direction of the first conveyance apparatus as at least one first movable conveying rail member, a second groove formed in the at least one first movable conveying rail member in which the first conveyance rod is reciprocatably arranged, a first spacing adjustment mechanism provided in the first conveyance apparatus for adjusting the spacing between the first conveying rail members according to widths of the object, a first switching mechanism arranged in the first conveyance apparatus that causes the first conveyance rod to perform an axial rotation in a forward or reverse direction around an axis line thereof, at least one first pusher member on the first conveyance rod, the first pusher member assuming an engagement position in which the first pusher member engages with the object and a retracted position in which the first pusher member departs from the object by causing the first switching mechanism to go into action, at least one second conveyance rod arranged in the second conveyance apparatus and capable of a reciprocating motion in a longitudinal direction of the second conveyance apparatus for conveying the object out of the treatment section, a pair of second conveying rail members provided in the second conveyance apparatus for supporting the object, at least either of the second conveying rail members being movable in the width direction of the second conveyance apparatus as at least one second movable conveying rail member, a third groove formed in the at least one second movable conveying rail member in which the second conveyance rod is reciprocatably arranged, a second spacing adjustment mechanism provided in the second conveyance apparatus for adjusting the spacing between the second conveying rail members according to widths of the object, a second switching mechanism arranged in the second conveyance apparatus that causes the second conveyance rod to perform an axial rotation in a forward or reverse direction around an axis line thereof, at least one second pusher member on the second conveyance rod, the second pusher member assuming an engagement position in which the second pusher member engages with the object and a retracted position in which the second pusher member departs from the object by causing the second switching mechanism to go into action, wherein a movable support member in the treatment section has a first groove into which the second conveyance rod is inserted, and the spacing between the right and left support members in the treatment section is adjusted by displacing the second conveyance rod in the width direction of the second conveyance apparatus, with the second conveyance rod inserted into the first groove.

2. The heat processing device according to claim 1, wherein the heat processing device is a reflow furnace, and the treatment section is a decomposition chamber.

* * * * *